US012772662B2

(12) United States Patent
You

(10) Patent No.: US 12,772,662 B2
(45) Date of Patent: Oct. 20, 2026

(54) EMISSIVE DISPLAY DEVICE

(71) Applicant: Samsung Display Co., Ltd., Yongin-Si (KR)

(72) Inventor: Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/832,851

(22) Filed: Jun. 6, 2022

(65) Prior Publication Data

US 2023/0180525 A1 Jun. 8, 2023

(30) Foreign Application Priority Data

Dec. 2, 2021 (KR) ........................ 10-2021-0170938

(51) Int. Cl.
*H10K 59/122* (2023.01)
*H10K 59/121* (2023.01)

(52) U.S. Cl.
CPC ......... *H10K 59/122* (2023.02); *H10K 59/121* (2023.02)

(58) Field of Classification Search
CPC ........................... H10K 59/122; H10K 59/124
See application file for complete search history.

(56) References Cited

U.S. PATENT DOCUMENTS

2010/0187986 A1* 7/2010 Kajitani ............... H10K 50/841 313/504
2013/0017752 A1* 1/2013 Kajitani ................. H05B 33/10 216/13
2013/0288413 A1* 10/2013 Choi .................... H10K 59/122 438/34
2014/0103385 A1 4/2014 Hatano et al.
2018/0190739 A1* 7/2018 Paek .................... H10K 59/122
2018/0190839 A1* 7/2018 Yoshikawa ........... H01L 31/068
2019/0326372 A1 10/2019 Han et al.
2020/0043998 A1* 2/2020 Choi .................... H10K 59/122
2020/0328263 A1* 10/2020 Choi .................... H10K 50/844
2021/0057504 A1 2/2021 Ko et al.
2021/0066639 A1 3/2021 Ko et al.

FOREIGN PATENT DOCUMENTS

JP 2010033936 A * 2/2010
JP 2014-082132 A 5/2014
KR 10-0195120 B1 6/1999
KR 2007071902 A * 7/2007 ......... H01L 27/3244
KR 10-1193196 B1 10/2012
KR 10-2013-0041771 A 4/2013
KR 2016072010 A * 6/2016 ......... H01L 27/3246
KR 10-2018-0083459 A 7/2018
(Continued)

*Primary Examiner* — Michele Fan

(74) *Attorney, Agent, or Firm* — Innovation Counsel LLP

(57) ABSTRACT

An emissive display device according to an embodiment includes: a substrate; a transistor disposed on the substrate; an insulating layer disposed on the transistor; a pixel electrode disposed on the insulating layer and electrically connected to the transistor; and a partition disposed on the insulating layer and covering at least an edge of the pixel electrode to expose a center of the pixel electrode. The partition includes a first partition in contact with a side surface of the pixel electrode, and a second partition in contact with an upper surface of the pixel electrode.

20 Claims, 13 Drawing Sheets

(56) References Cited

FOREIGN PATENT DOCUMENTS

| | | | |
|---|---|---|---|
| KR | 10-2019-0122073 | A | 10/2019 |
| KR | 10-2020-0014463 | A | 2/2020 |
| KR | 10-2020-0119946 | A | 10/2020 |
| KR | 10-2021-0022206 | A | 3/2021 |
| KR | 10-2021-0028780 | A | 3/2021 |
| KR | 10-2021-0043792 | A | 4/2021 |
| KR | 10-2021-0073092 | A | 6/2021 |
| KR | 10-2021-0076293 | A | 6/2021 |

* cited by examiner

EMISSIVE DISPLAY DEVICE

CROSS-REFERENCE TO RELATED APPLICATION

This application claims priority to and benefits of Korean Patent Application No. 10-2021-0170938, filed in the Korean Intellectual Property Office on Dec. 2, 2021, the entire contents of which are incorporated herein by reference.

BACKGROUND

(a) Technical Field

This disclosure relates to a display device, and more particularly, to an emissive display device including a light emitting diode, and a manufacturing method thereof.

(b) Description of the Related Art

An emissive display device may include light emitting diodes corresponding to pixels and may display an image by controlling luminance of each of the light emitting diodes. Unlike a light-receiving type of display device such as a liquid crystal display, the emissive display device may not require a separate light source, thus it is possible to reduce thickness and weight thereof. In addition, the emissive display device has characteristics such as high luminance, high contrast ratio, high color reproduction, high response speed, and the like, to display a high quality image.

Thanks to such merits, the emissive display device is applied to various electronic devices including mobile devices such as smart phones and tablets, monitors, televisions, and the like, and has been in the spotlight as a display device for vehicles.

The above information disclosed in this Background section is only for enhancement of understanding of the background, and therefore, it may contain information that does not form the prior art that is already known in this country to a person of ordinary skill in the art.

SUMMARY

An emissive display device may include a partition defining a pixel region. As for the emissive display device, a black partition including a black pigment and/or a black dye may be used to improve optical characteristics such as a contrast ratio. In a process of forming the black partition or a subsequent process, a material for forming the black partition may remain on a pixel electrode or metal particles may migrate over the pixel electrode, resulting in defects such as dark dots.

Embodiments have been made in an effort to provide an emissive display device and a manufacturing method, capable of preventing defect occurrence while improving image quality.

An emissive display device according to an embodiment includes: a substrate; a transistor disposed on the substrate; an insulating layer disposed on the transistor; a pixel electrode disposed on the insulating layer and electrically connected to the transistor; and a partition disposed on the insulating layer and covering at least an edge of the pixel electrode to expose a center of the pixel electrode. The partition includes a first partition in contact with a side surface of the pixel electrode, and a second partition in contact with an upper surface of the pixel electrode.

The first partition and the pixel electrode may be in contact with the insulating layer and the second partition may not be in contact with the insulating layer.

A portion of a lower surface of the second partition may be in contact with the pixel electrode, and a portion of the lower surface of the second partition may be in contact with the first partition.

The second partition may protrude laterally from an edge of the pixel electrode.

The opening may include a first opening defined by the first partition and a second opening defined by the second partition, and the first opening and the second opening may substantially have a same planar shape.

A side surface of the first partition defining the first opening and a side surface of the second partition defining the second opening may form substantially a seamless line.

The first partition may cover at least a portion of a side surface of the second partition defining the second opening.

The first partition may be in contact with an upper surface of the pixel electrode while covering an entire side surface of the second partition defining the second opening.

The emissive display device may further include an emission layer disposed on the pixel electrode. A thickness of the second partition may be greater than a thickness of the emission layer.

The emissive display device may further include a common electrode disposed on the emission layer. A thickness of the second partition may be greater than a sum of a thickness of the emission layer and a thickness of the common electrode.

The first partition may be a black partition including a black pigment or a black dye, and the second partition may be a transparent partition.

The emissive display device may further include an extension extending from the pixel electrode and connected to the transistor or connected to the transistor via a connecting electrode. The first partition may be in contact with a side surface of the extension and the second partition may be in contact with an upper surface of the extension.

An emissive display device according to an embodiment includes: a substrate; a transistor disposed on the substrate; an insulating layer disposed on the transistor; a pixel electrode disposed on the insulating layer, contacting the insulating layer and electrically connected to the transistor; a partition disposed on the insulating layer, the partition covering at least an edge of the pixel electrode and exposing a center of the pixel electrode; an emission layer disposed on the pixel electrode to overlap the opening; and a common electrode disposed on the emission layer. The partition may include a first partition in contact with the insulating layer and not in contact with an upper surface of the pixel electrode, and a second partition in contact with the upper surface of the pixel electrode and not in contact with the insulating layer.

The first partition may be in contact with a side surface of the pixel electrode, and the second partition may not be in contact with the side surface of the pixel electrode.

The second partition may be spaced apart from the insulating layer by a thickness of the pixel electrode.

The first partition may fill a gap between the second partition and the insulating layer.

The emissive display device may further include a spacer disposed between the partition and the common electrode. The spacer may be in contact with the first partition and may not be in contact with the second partition.

The emissive display device may further include an extension extending from the pixel electrode to be connected to the transistor or connected to the transistor via a connecting electrode through a contact hole formed in the insulating layer. The extension may be connected to the transistor or the connecting member through a contact hole formed in the insulating layer. The first partition may be in contact with a side surface of the extension and the second partition may be in contact with an upper surface of the extension.

A thickness of the second partition may be greater than a sum of a thickness of the emission layer and a thickness of the common electrode.

An emissive display device according to an embodiment includes: a substrate; a transistor disposed on the substrate; an insulating layer disposed on the transistor; a pixel electrode disposed on the insulating layer and electrically connected to the transistor; and a partition disposed on the insulating layer and covering at least an edge of the pixel electrode to expose a center of the pixel electrode. The partition may include a first partition and a second partition that is at least partially covered by the first partition, upper and side surfaces of the second partition may be in contact with the first partition, and a lower surface of the second partition may be in contact with the pixel electrode and the first partition.

According to the embodiments, it is possible to prevent occurrence of defects such as dark dots while improving image quality of the emissive display device. Further, according to the embodiments, there are other advantageous effects that can be recognized throughout the specification.

DETAILED DESCRIPTION OF THE EMBODIMENTS

Figure 1:
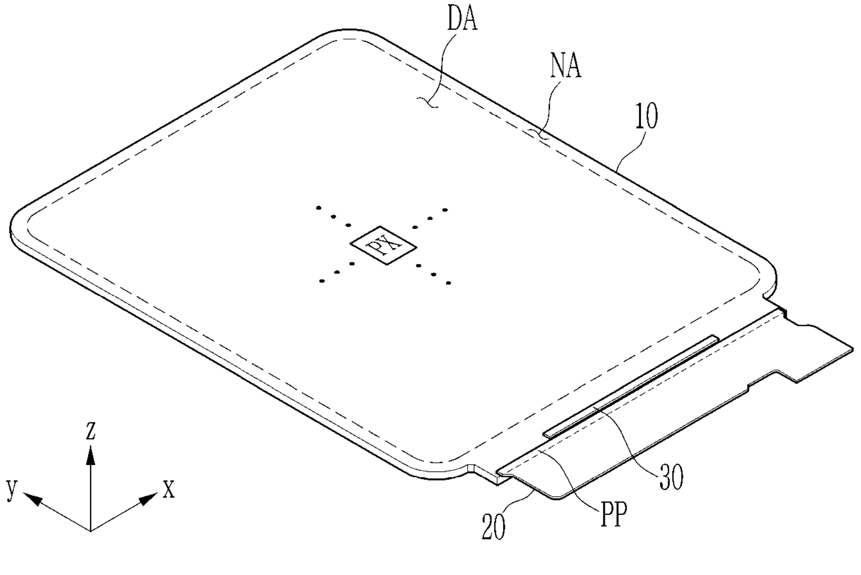
FIG. 1 illustrates a schematic perspective view showing an emissive display device according to an embodiment.

The inventive concept will be described more fully hereinafter with reference to the accompanying drawings, in which embodiments are shown.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction.

FIG. 1 illustrates a schematic perspective view showing an emissive display device according to an embodiment.

Referring to FIG. 1, the emissive display device (hereinafter, simply referred to as a "display device") may include a display panel 10, a flexible printed circuit film 20 bonded to the display panel 10, and a driving device including an integrated circuit chip 30 and the like.

The display panel 10 may include a display area DA corresponding to a screen on which an image is displayed and a non-display area NA, and circuits and/or signal lines for generating and/or transferring various signals and voltages applied to the display area DA are disposed in the non-display area NA. The non-display area NA may be disposed to surround a periphery of the display area DA. In FIG. 1, inside and outside of a dotted rectangle correspond to the display area DA and the non-display area NA, respectively.

Pixels PX are disposed in a matrix form in the display area DA of the display panel 10. In addition, signal lines such as a gate line (also referred to as a scan line), a data line, and a driving voltage line may be disposed in the display area DA. A gate line, a data line, a driving voltage line, etc. are connected to each pixel PX, and each pixel PX may receive a gate signal (also referred to as a scan signal), a data voltage, and a driving voltage (also referred to as a first power voltage or a high potential power voltage) from these signal lines. The pixel PX may be implemented as a light-emitting device such as a light emitting diode.

A touch sensor for detecting a user's touch and/or a non-contact touch may be disposed in the display area DA. Although the display area DA having a substantially rectangular shape is illustrated, the display area DA may have various shapes such as a polygonal shape, a circular shape, an elliptical shape, and the like.

A pad portion PP in which pads for receiving signals from the outside of the display panel 10 may be disposed in the non-display area NA of the display panel 10. The pad portion PP may be disposed to extend in a first direction x along one edge of the display panel 10. The flexible printed circuit film 20 is bonded to the pad portion PP, and pads of the flexible printed circuit film 20 may be electrically connected to pads of the pad portion PP.

A panel driver may be disposed in the non-display area NA of the display panel 10 to generate and/or process various signals for driving the display panel 10. The panel driver may include a data driver for applying a data voltage to the data line, a gate driver for applying a gate signal to the gate line, and a signal controller for controlling the data driver and the gate driver. The pixels PX may receive the data voltage at predetermined timing depending on the gate signal generated by the gate driver. The gate driver may be integrated in the display panel 10 and may be disposed on at least one side of the display area DA. The data driver and the signal controller may be provided as an integrated circuit chip (also referred to as a driving IC chip) 30 and the integrated circuit chip 30 may be mounted in the non-display area NA of the display panel 10. The integrated circuit chip 30 may be mounted on the flexible printed circuit film 20 or the like to be electrically connected to the display panel 10.

Figure 2:
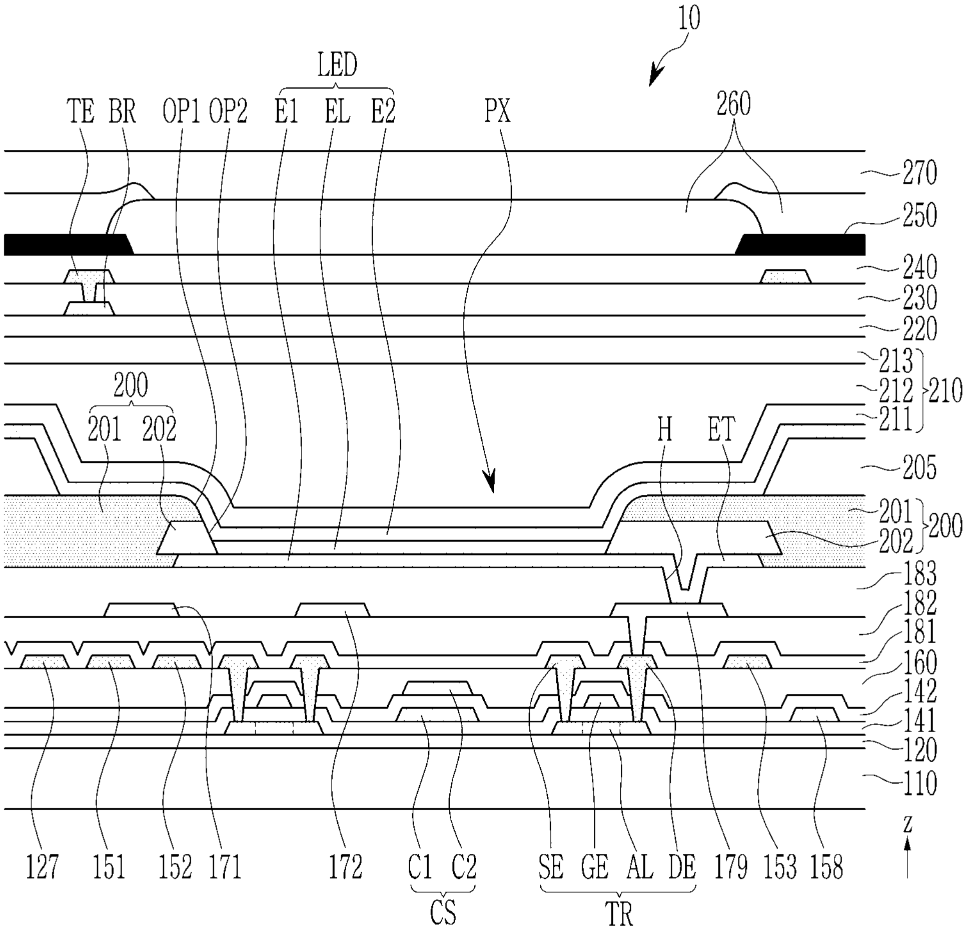
FIG. 2 illustrates a schematic cross-sectional view of one pixel area in a display panel according to an embodiment.

FIG. 2 illustrates a schematic cross-sectional view of one pixel area in a display panel according to an embodiment.

Referring to FIG. 2, the display panel 10 may basically include a substrate 110, a transistor TR positioned on the substrate 110, and a light emitting diode LED connected to the transistor TR. The light emitting diode LED may correspond to the pixel PX.

The substrate 110 may be a rigid substrate including glass. The substrate 110 may be a flexible substrate including a polymer layer made of, e.g., a polyimide, a polyamide, and polyethylene terephthalate.

A buffer layer 120 may be disposed on the substrate 110. The buffer layer 120 may improve a characteristic of a semiconductor layer AL by blocking impurities from the substrate 110 when the semiconductor layer AL is formed, and may flatten a surface of the substrate 110 to relieve a stress of the semiconductor layer AL. The buffer layer 120 may include an inorganic insulating material such as a silicon nitride ($SiN_x$), a silicon oxide ($SiO_x$), or a silicon oxynitride ($SiO_xN_y$). The buffer layer 120 may include amorphous silicon.

The semiconductor layer AL may be disposed on the buffer layer 120. The semiconductor layer AL may include a first region and a second region, and a channel region disposed therebetween. The semiconductor layer AL may include polysilicon, amorphous silicon, or an oxide semiconductor.

A first gate insulating layer 141 may be disposed on the semiconductor layer AL. The first gate insulating layer 141 may include an inorganic insulating material such as a silicon oxide, a silicon nitride, or a silicon oxynitride, and may be a single layer or multiple layers.

A first gate conductive layer, which may include a gate electrode GE, a first electrode C1 of the storage capacitor CS, a bypass control line 158, and the like, may be positioned on the first gate insulating layer 141. The first gate conductive layer may be formed by using a same material in a same process. The gate electrode GE may overlap a channel region of the semiconductor layer AL. The first gate conductive layer may include molybdenum (Mo), aluminum (Al), copper (Cu), titanium (Ti), tungsten (W), or the like, and may be a single layer or multiple layers.

A second gate insulating layer 142 may be disposed on the first gate conductive layer. The second gate insulating layer 142 may include an inorganic insulating material such as a silicon nitride, a silicon oxide, or a silicon oxynitride, and may be a single layer or multiple layers.

A second gate conductive layer that may include a second electrode C2 of the storage capacitor CS and the like may be disposed on the second gate insulating layer 142. The second electrode C2 may overlap the first electrode C1, and the first electrode C1, the second electrode C2, and the second gate insulating layer 142 disposed therebetween may constitute a storage capacitor CS. The second gate conductive layer may be formed by using a same material in a same process. The second gate conductive layer may include molybdenum (Mo), aluminum (Al), copper (Cu), titanium (Ti), tungsten (W), or the like, and may be a single layer or multiple layers.

An interlayer insulating layer 160 may be disposed on the second gate conductive layer. The interlayer insulating layer 160 may include an inorganic insulating material such as a silicon nitride, a silicon oxide, or a silicon oxynitride, and may be a single layer or multiple layers. When the interlayer insulating layer 160 includes the multiple layers, a lower layer thereof may include a silicon nitride, and an upper layer thereof may include a silicon oxide.

A first data conductive layer that may include a first electrode SE and a second electrode DE of the transistor TR, an initialization voltage line 127, a scan line 151, a previous-stage scan line 152, an emission control line 153, and the like may be disposed on the interlayer insulating layer 160. One of the first electrode SE and the second electrode DE may serve as a source electrode of the transistor TR, and the other may serve as a drain electrode of the transistor TR. At least one of the initialization voltage line 127, the scan line 151, the previous-stage scan line 152, or the emission control line 153 may be included in the first gate conductive layer or the second gate conductive layer. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or the like, and may be a single layer or multiple layers. For example, the first data conductive layer may have a triple-layer structure including, e.g., titanium (Ti)-aluminum (Al)-titanium (Ti), or a double-layer structure including, e.g., titanium (Ti)-copper (Cu).

A passivation layer 181 may be disposed on the first data conductive layer. The passivation layer 181 may include an inorganic insulating material such as a silicon oxide or a silicon nitride.

A first planarization layer 182 may be disposed on the passivation layer 181. The first planarization layer 182 may include an organic insulating material such as a general purpose polymer such as poly(methyl methacrylate) and polystyrene, a polymer derivative having a phenolic group, an acrylic polymer, an imide-based polymer (e.g., polyimide), or a siloxane-based polymer.

A second data conductive layer that may include a data line 171, a driving voltage line 172, a connecting electrode 179, etc. may be disposed on the first planarization layer 182. The connecting electrode 179 may be connected to the second electrode DE of the transistor TR through a contact hole formed in the first planarization layer 182 and the passivation layer 181. The second conductive layer may further include at least one of the initialization voltage line 127, the scan line 151, the previous scan line 152, or the emission control line 153. At least one of the data line 171 or the driving voltage line 172 may be included in the first data conductive layer. The second data conductive layer may be formed by using a same material in a same process. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or the like, and may be a single layer or multiple layers. For example, the second data conductive layer may have a triple-layer structure including, e.g., titanium (Ti)-aluminum (Al)-titanium (Ti), or a double-layer structure including, e.g., titanium (Ti)/copper (Cu).

A second planarization layer 183 may be disposed on the second data conductive layer. The second planarization layer 183 may contain an organic insulating material such as a general purpose polymer such as poly(methyl methacrylate) or styrene, a polymer derivative having a phenolic group, an acrylic polymer, an imide-based polymer, or a siloxane-based polymer.

The pixel electrode E1 of the light emitting diode LED and an extension ET may be positioned on the second planarization layer 183. The extension ET may extend from the pixel electrode E1, may be a portion that is covered by a partition 200, and may be connected to the connection electrode 179 through the contact hole H formed in the second planarization layer 183. The extension ET may include a portion positioned in the contact hole H and a portion positioned on the second planarization layer 183. The extension ET may be integrally formed with the pixel electrode E1. Since the connecting electrode 179 is connected to the second electrode DE, the pixel electrode E1 may be electrically connected to the second electrode DE through the extension ET and the connecting electrode 179. The pixel electrode E1 and the extension ET may each be formed of a reflective conductive material or a translucent conductive material, or may be formed of a transparent conductive material. The pixel electrode E1 may include a transparent conductive material such as an indium tin oxide (ITO) or an indium zinc oxide (IZO). The pixel electrode E1 may include a metal such as lithium (Li), calcium (Ca), aluminum (Al), silver (Ag), magnesium (Mg), or gold (Au). The pixel electrode E1 may have a multi-layered structure, e.g., may have a triple-layer structure including, e.g., ITO-silver (Ag)-ITO.

The partition 200 (also referred to as a pixel defining layer or a bank) having first and second openings OP1 and OP2 exposing the pixel electrode E1 may be positioned on the second planarization layer 183. The partition 200 may define an emission area. The partition 200 may cover an edge of the pixel electrode E1. That is, the edge of the pixel electrode E1 may be covered by the partition 200, and a width covered by the partition 200 may be about 3 μm or less. The partition 200 may cover the entire extension ET.

The partition 200 may include a first partition 201 and a second partition 202. Among the openings OP1 and OP2 of the partition 200, the first opening OP1 may be defined by the first partition 201 and the second opening OP2 may be defined by the second partition 202. The first opening OP1 and the second opening OP2 may have substantially a same planar shape. In the cross-sectional view, the first opening OP1 may be positioned above the second opening OP2.

The second partition 202 may be disposed on the extension ET to cover the extension ET completely. The second partition 202 may surround an edge of the pixel electrode E1 and/or the extension ET. The second partition 202 may be positioned to protrude laterally slightly more than the edge of the pixel electrode E1 and/or the extension ET while covering the edge of the pixel electrode E1 and/or the extension ET. For example, the extension ET and/or the pixel electrode E1 may have undercut portions in which edges of the extension ET and the pixel electrode E1 are retracted from edges of the second partition 202. The second partition 202 may be in contact with the upper surface of the extension ET and/or the pixel electrode E1, but may not be in contact with side surfaces of the extension ET and/or the pixel electrode E1. The second partition 202 may be positioned to be spaced apart from the second planarization layer 183 by about a thickness of the pixel electrode E1. At least a portion of the second partition 202 may be covered by the first partition 201. An upper surface of the second partition 202 may be in direct contact with the first partition 201 and may be covered by the first partition 201. A portion of the lower surface of the second partition 202 may directly contact the pixel electrode E1 and/or the extension ET, and a portion of the second partition 202 may directly contact the first partition 201. A side surface of the second partition 202 that does not define the second opening OP2 may directly contact the first partition 201 and may be covered by the first partition 201. The side surface of the second partition 202 defining the second opening OP2 may not be covered by the first partition 201. The side surface of the second partition 202 defining the second opening OP2 and the side surface of the first partition 201 defining the first opening OP1 may form a substantially seamless line. The second partition 202 may include an organic insulating material such as an acryl-based polymer, an imide-based polymer, or an amide-based polymer. For example, the second partition 202 may include a polyimide. The second partition 202 may be a transparent partition that does not include a colored pigment and/or a colored dye.

The first partition 201 may be disposed on the second partition 202. The first partition 201 may surround an edge of the pixel electrode E1 and be in direct contact with an upper surface of the second partition 202. The first partition 201 may overlap the edge of the pixel electrode E1 and/or the extension ET. The first partition 201 may fill the undercut portions and directly contact side surfaces of the pixel electrode E1 and/or the second partition 202. The first partition 201 overlaps the extension ET and may be in direct contact with side surfaces of the extension ET and the pixel electrode E1 but may not be in direct contact with an upper surface of the extension ET and/or an upper surface of the pixel electrode E1. A lower surface of the first partition 201 may be in direct contact with an upper surface of the second planarization layer 183. The first partition 201 may include an organic insulating material such as an acryl-based polymer, an imide-based polymer (e.g., polyimide), or an amide-based polymer (e.g., polyamide). The first partition 201 may be a black partition including a colored pigment such as a black pigment or a blue pigment. For example, the first partition 201 may include a polyimide binder and red, green, and blue pigments. For example, the first partition 201 may include a cardo binder resin and a mixture of a lactam black pigment and a blue pigment. The first partition 201 may include carbon black. The black partition may improve a contrast ratio, and may prevent reflection by a metal layer disposed therebelow.

During manufacture or use of the display panel 10, a material (e.g., silver (Ag)) that may be eluted from the pixel electrode E1 may move and be aggregated, and the agglomerated material may cause a short-circuit between the pixel electrode E1 and the common electrode E2, and thus dark spots may occur. In particular, the first partition 201, which may be a black partition, may facilitate material movement and aggregation, while the second partition 202, which may be a transparent partition, may inhibit material movement and aggregation. Since the second partition 202 covers the edge of the pixel electrode E1, it is possible to prevent or reduce defects such as dark spots by suppressing movement and aggregation of a material eluted from the pixel electrode E1.

An emission layer EL may be disposed on the pixel electrode E1. The emission layer EL may overlap the first and second openings OP1 and OP2. At least a portion of the emission layer EL may be positioned within the second opening OP2. A thickness of the emission layer EL may be thinner than that of the second partition 202, and a height of a central portion of the emission layer EL may be lower than that of the second partition 202. The emission layer EL may include a material layer that uniquely emits light of primary colors such as red, green, and blue. The emission layer EL may have a structure in which material layers emitting light of different colors are stacked. At least one of a hole injection layer and a hole transport layer may be disposed between the pixel electrode E1 and the emission layer, at least one of an electron transport layer and an electron injection layer may be disposed on the emission layer EL.

A spacer 205 may be positioned on the partition 200. The spacer 205 may contact the first partition 201 and may not contact the second partition 202. The spacer 205 may include an organic insulating material such as an acryl-based polymer, an imide-based polymer, or an amide-based polymer.

A common electrode E2 (also referred to as opposed electrode) may be positioned on the emission layer EL and the partition 200. The common electrode E2 may be positioned over a plurality of pixels PX. A height of a portion of the common electrode E2 overlapping a central portion of the emission layer EL may be lower than that of the second partition 202. A sum of thicknesses of the common electrode E2 and the light emitting layer EL may be thinner than a thickness of the second partition 202. The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrode E2 may include a transparent conductive oxide (TCO) such as an indium tin oxide (ITO) or an indium zinc oxide (IZO).

The pixel electrode E1, the emission layer EL, and the common electrode E2 constitute a light emitting diode LED, which may be an organic light emitting diode. The pixel electrode E1 may be an anode that is a hole injection electrode, and the common electrode E2 may be a cathode that is an electron injection electrode, and vice versa. The first and second openings OP1 and OP2 of the partition 200 may correspond to an emission area of the light emitting diode LED.

An encapsulation layer 210 may be disposed on the common electrode E2. The encapsulation layer 210 may encapsulate light emitting diodes LED and may prevent penetration of moisture or oxygen from the outside. The encapsulation layer 210 may be a thin film encapsulation layer including one or more inorganic layers and one or more organic layers which are stacked on the common electrode E2. For example, the encapsulation layer 210 may have a triple layer structure of a first inorganic layer 211, an organic layer 212, and a second inorganic layer 213. The encapsulation layer 210 may be provided in a form of a substrate.

A first insulating layer 220 may be disposed on the encapsulation layer 210. The first insulating layer 220 may cover the encapsulation layer 210 to protect the encapsulation layer 210 and to prevent moisture permeation. The first insulating layer 220 may reduce parasitic capacitance between the common electrode E2 and a touch electrode TE disposed on the common electrode E2.

A first touch conductive layer including a bridge BR may be disposed on the first insulating layer 220. A second insulating layer 230 may be positioned on the first touch conductive layer. A second touch conductive layer including touch electrodes TE may be positioned on the second insulating layer 230. A passivation layer 240 may be positioned on the second touch conductive layer.

The touch electrodes TE may include first and second touch electrodes constituting a mutual sensing capacitor. The bridge BR may electrically connect the first touch electrodes or the second touch electrodes. For example, first touch electrodes that are adjacently separated from each other may be connected to the bridge BR through contact holes formed in the second insulating layer 230, and may be electrically connected through the bridge BR.

The first insulating layer 220 and the second insulating layer 230 may each include an inorganic insulating material such as a silicon nitride, a silicon oxide, and a silicon oxynitride, and may be a single layer or multiple layers. The passivation layer 240 may include an organic insulating material such as an acryl-based polymer or an imide-based polymer, or an inorganic insulating material such as a silicon nitride, a silicon oxide, or a silicon oxynitride.

A first touch conductive layer and a second touch conductive layer may each have a mesh shape having an opening overlapping the emission area of the light emitting diode LED. The first touch conductive layer and the second touch conductive layer may each include a metal such as aluminum (Al), copper (Cu), titanium (Ti), molybdenum (Mo), silver (Ag), chromium (Cr), or nickel (Ni), and may be a single layer or multiple layers. For example, the first touch conductive layer and/or the second touch conductive layer may have a triple layer structure including, e.g., titanium (Ti)/aluminum (Al)/titanium (Ti).

A light blocking member 250 may be disposed on the passivation layer 240. The light blocking member 250 may contain a black pigment and/or a black dye, and may reduce or prevent light reflection caused by a metal layer of the display panel 10 and the like. The light blocking member 250 may be positioned so as not to overlap the first and second openings OP1 and OP2 which are emission areas. The light blocking member 250 may be referred to as a black matrix.

A color filter 260 may be positioned on the light blocking member 250 on the passivation layer 240. The color filter 260 may transmit any one of, e.g., red, green, and blue light. Color filters 260 representing different colors may overlap in a region overlapping the light blocking member 250.

The color filter 260 and the light blocking member 250 may be combined to function as an anti-reflection layer. In such a structure, a polarization layer may not be required as an anti-reflection layer and thus light output efficiency may be increased, and a thickness of the display panel 10 may be reduced. The color filter 260 may include quantum dots or phosphors and may convert light emitted from the light emitting diode LED into red or green light. An overcoat layer 270 may be disposed on the color filter 260. The display panel 10 may further include a polarization layer as an anti-reflection layer.

Figure 3:
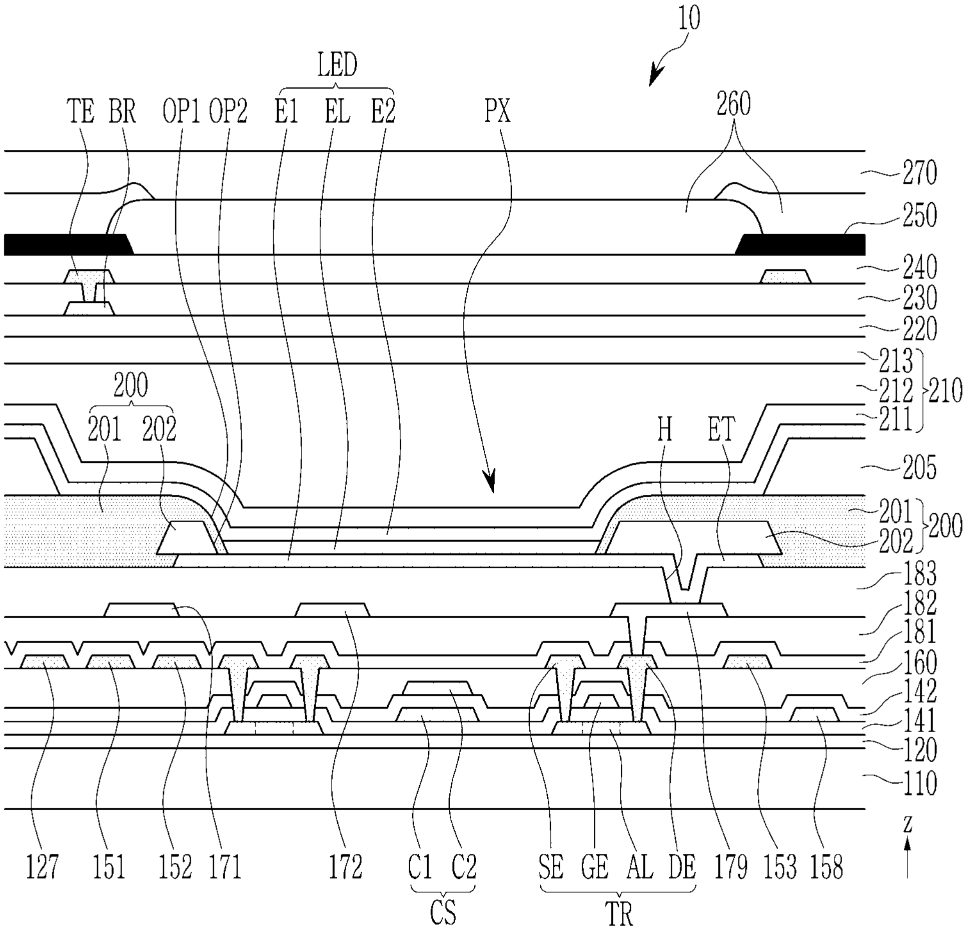
FIG. 3 illustrates a schematic cross-sectional view of one pixel area in a display panel according to an embodiment.

FIG. 3 illustrates a schematic cross-sectional view of one pixel area in a display panel according to an embodiment.

The embodiment illustrated in FIG. 3 is different from the embodiment illustrated in FIG. 2 in the structure of the partition 200. Specifically, the partition 200 may include a first partition 201 and a second partition 202. A disposal and a shape of the second partition 202 may be substantially the same as in the embodiment of FIG. 2. The first partition 201 may cover the entire second partition 202. The first partition 201 may cover a side surface of the second partition 202 defining the second opening OP2, and may contact an upper surface of the pixel electrode E1. A side surface of the second partition 202 defining the second opening OP2 may be in contact with the first partition 201. In the first and second openings OP1 and OP2, a width of the first opening OP1 may be smaller than that of the second opening OP2 in a plan view because the first partition 201 covers side surfaces of the second partition 202. The first opening OP1 may be positioned in the second opening OP2. The above mentioned structure may be formed by patterning the first partition 201 after the second partition 202 is patterned or by reflowing the first partition 201 after materials for forming the first partition 201 and the second partition 202 is simultaneous patterned using the same mask. Unlike the drawing, the first partition 201 may partially cover a side surface of the second partition 202 defining the second opening OP2.

Hereinafter, a manufacturing method of an emissive display device (particularly, a display panel) according to an embodiment will be described.

FIGS. 4 to 11 illustrate process cross-sectional views showing a manufacturing method of an emissive display device according to an embodiment.

Figure 4:
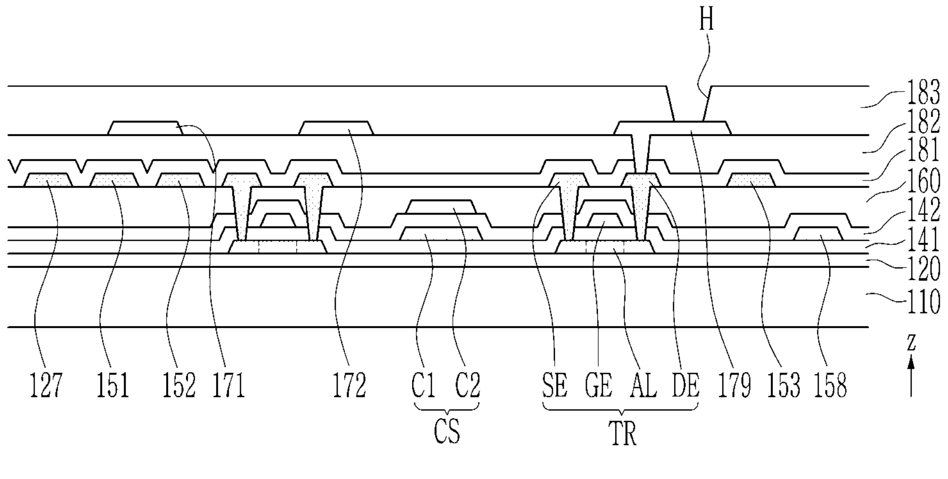
FIGS. 4, 5, 6, 7, 8, 9, 10, and 11 illustrate process cross-sectional views showing a manufacturing method of an emissive display device according to an embodiment.

Referring to FIG. 4, a buffer layer 120 may be formed on the substrate 110. After a semiconductor material layer is formed on the buffer layer 120 and patterned, the semiconductor layer AL of the transistor TR may be formed. Herein, the patterning may indicate forming a predetermined pattern by removing a portion of the layer through a photolithography process or the like. A first gate insulating layer 141 may be formed on the semiconductor layer AL. A conductive material layer may be formed on the first gate insulating layer 141 and then patterned to form a first gate conductive layer that may include the gate electrode GE of the transistor TR, the first electrode C1 of the storage capacitor CS, the bypass control line 158, and the like. A second gate insulating layer 142 may be formed on the first gate conductive layer. A second gate conductive layer that may include the second electrode C2 of the storage capacitor CS and the like may be formed on the second gate insulating layer 142. The interlayer insulating layer 160 may be formed on the second gate conductive layer. A conductive material layer may be formed on the interlayer insulating layer 160 and then patterned to form a first data conductive layer that may include the first electrode SE and the second electrode DE of the transistor TR, the initialization voltage line 127, the scan line 151, the previous scan line 152, the emission control line 153, and the like. A passivation layer 181 may be formed on the first data conductive layer. A first planarization layer 182 may be formed on the passivation layer 181. A conductive material layer may be formed on the first planarization layer 182 and then patterned to form a second data conductive layer that may include the data line 171, the driving voltage line 172, the connecting electrode 179, and the like. A second planarization layer 183 may be formed on the second data conductive layer. The contact hole H overlapping the connecting electrode 179 may be formed by patterning the second planarization layer 183.

Figure 5:
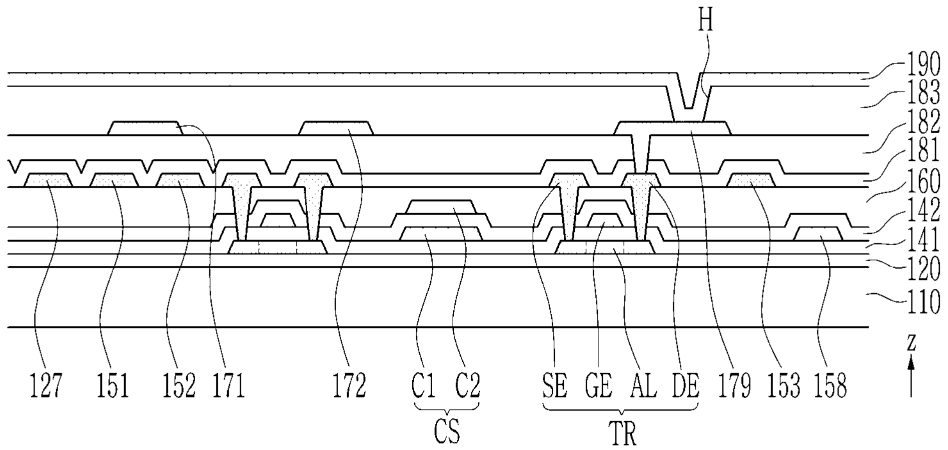

Referring to FIG. 5, a conductive material layer 190 may be formed on the second planarization layer 183. The conductive material layer 190 may be connected to the connecting electrode 179 through the contact hole H. The conductive material layer 190 may include a first conductive layer, a second conductive layer, and a third conductive layer that are sequentially formed. The first and third conductive layers may include a transparent conductive oxide (e.g., ITO), and the second conductive layer may include a metal (e.g., silver (Ag)).

Figure 6:
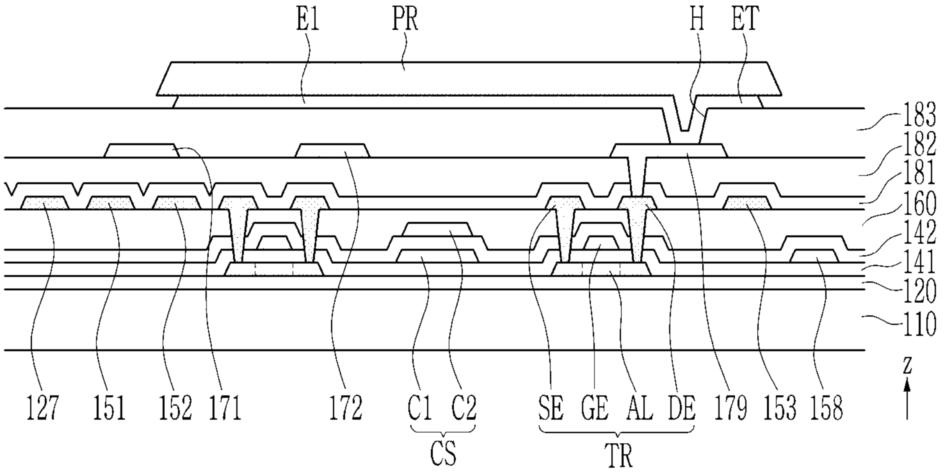

Referring to FIG. 6, the pixel electrode E1 and the extension ET may be formed by patterning the conductive material layer 190. The patterning of the conductive material layer 190 may be performed by etching the conductive material layer 190. For example, after applying (e.g., coating) a photoresist on the conductive material layer 190, a photosensitive film pattern PR may be formed using a photomask, and the pixel electrode E1 and the extension portion ET may be formed by wet-etching the conductive material layer 190 using the photosensitive film pattern PR as a mask. Since the wet etching is isotropic, an undercut in which not only a portion of the conductive material layer 190 not covered by the photosensitive film pattern PR but also a portion under the photoresist pattern PR is etched in a horizontal direction may occur. Accordingly, in a plan view, edges of the pixel electrode E1 and the extension portion ET may be positioned inside edges of the photosensitive film pattern PR. A photoresist for forming the photosensitive film pattern PR may be a positive photosensitive resin composition. The photosensitive resin composition may include an organic insulating material such as an acryl-based polymer, an imide-based polymer, or an amide-based polymer. For example, the photosensitive compound may include a photosensitive polyimide.

Figure 7:
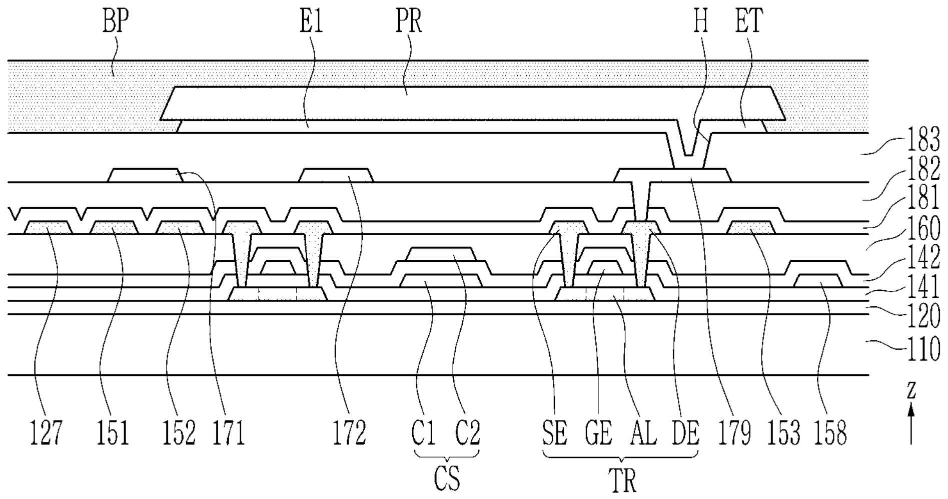

Referring to FIG. 7, after forming the pixel electrode E1 and the extension ET, a black photoresist BP for forming the first partition 201 may be applied without removing the photosensitive film pattern PR. The black photoresist BP may be a negative photosensitive resin composition. The photosensitive resin composition may include an organic insulating material such as an acryl-based polymer, an imide-based polymer, or an amide-based polymer. The black photoresist BP may be a negative photoresist. The black photoresist BP may completely cover the photosensitive film pattern PR, and may fill a gap or space between the photosensitive film pattern PR and the second planarization layer 183 which is formed due to the undercut of the conductive material layer 190.

Figure 8:
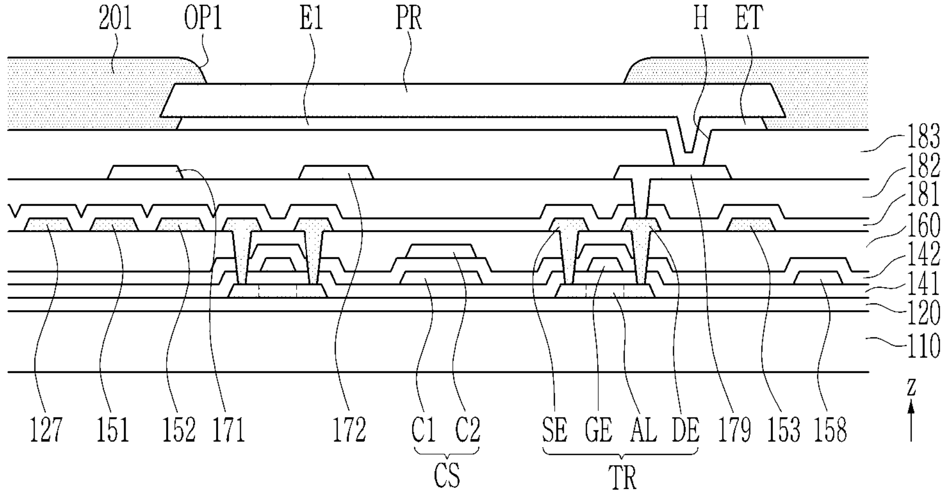

Referring to FIG. 8, the first partition 201 having the first opening OP1 may be formed by patterning the black photoresist BP. The first opening OP1 may be formed by, e.g., coating a black photoresist BP and then selectively irradiating light (e.g., UV) using a photomask and developing it. A portion of the coated black photoresist BP to which light is not irradiated may be removed using a developer, and the removed portion may correspond to the first opening OP1. The first opening OP1 may correspond to an emission area of the light emitting diode LED. The photosensitive film pattern PR may be exposed by the first opening OP1. A portion of the photosensitive film pattern PR that overlaps the edge of the pixel electrode E1 and the extension ET may be covered with the first partition 201. When the first partition 201 is formed, the pixel electrode E1 is covered by the photosensitive film pattern PR, it is possible to prevent the material forming the first partition 201 from contacting or adhering to the upper surface of the pixel electrode E1. In addition, it is possible to prevent particles of a metal such as silver (Ag) that may remain after the conductive material layer 190 is patterned from moving to the upper surface of the pixel electrode E1. Accordingly, defects such as dark spots that may be caused by such residues may be prevented.

Figure 9:
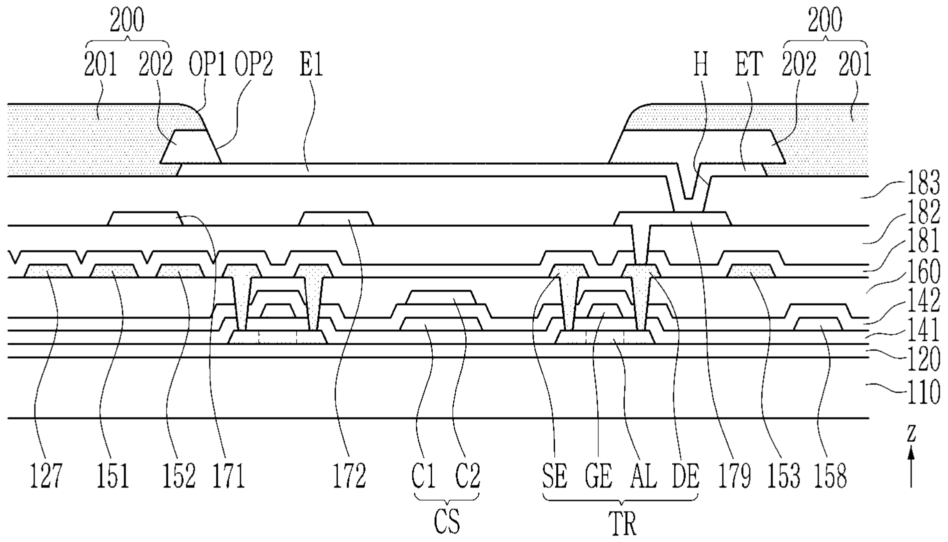

After the first partition 201 is formed, the photosensitive film pattern PR may be irradiated with light and developed to form the second partition 202 having the second opening OP2 as illustrated in FIG. 9. In this case, even with full exposure without using a photomask, a portion of the photosensitive film pattern PR not covered by the first partition 201 (i.e., a portion overlapping the first opening OP1) may be selectively exposed. A portion of the photosensitive film pattern PR irradiated with light may be removed using a developing solution, and the removed portion may correspond to the second opening OP2. The first partition 201 may be formed using a negative photosensitive resin composition, and the second partition 202 may be formed using a positive photosensitive resin composition, in order to form the second opening OP2 without using a photomask. Since the second opening OP2 is formed using the first opening OP1, the side surface of the second partition 202 defining the second opening OP2 and the side surface of the first partition 201 defining the first opening OP1 may form a substantially seamless line. As the second opening OP2 is formed, a corresponding portion of the emission area of the light emitting diode LED in the pixel electrode E1 may be exposed. When the second opening OP2 is formed, the forming material and/or metal particles of the first partition 201 that may remain on the photosensitive film pattern PR may be removed together. Such residues of the forming material and/or the metal particles of the first partition 201 may cause, e.g., a short-circuit between the pixel electrode E1 and the common electrode E2, thereby generating dark spots. When the photosensitive film pattern PR is removed, these residues may be removed together, so that defects such as dark spots may be prevented.

Meanwhile, when the conductive material layer 190 for forming the pixel electrode E1 is patterned, a third conductive layer near the edge of the pixel electrode E1 may be damaged. When the third conductive layer is damaged, a material of the second conductive layer including, e.g., silver (Ag) may be eluted through the third conductive layer in a subsequent process (e.g., curing of the partition 200). The eluted material may agglomerate and cause a short-circuit between the pixel electrode E1 and the common electrode E2, which may cause dark spots. Unlike the first partition 201 which is a black partition, the second partition 202 may suppress movement and aggregation of eluted materials. Accordingly, as in the embodiment, a structure in which the second partition 202 covers the edge of the pixel electrode E1 may be advantageous in preventing defects such as dark dots.

Figure 10:
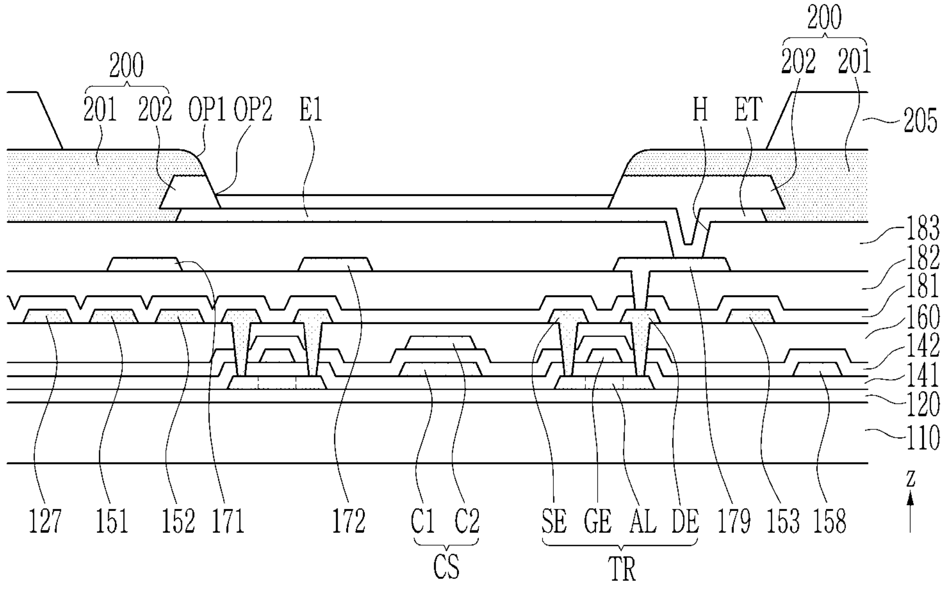

Referring to FIG. 10, a spacer 205 may be formed on the partition 200. The spacer 205 may be formed to contact a fine metal mask in order to prevent damage to a pre-formed structure by the fine metal mask used when the emission layer EL is deposited. The spacer 205 may include an organic insulating material such as an acryl-based polymer, an imide-based polymer, or an amide-based polymer. The spacer 205 may have various planar shapes, such as a polygon, e.g., a triangle, or a circle. After the spacer 205 is formed, the emission layer EL may be formed on the pixel electrode E1. The emission layer EL may be deposited using a fine metal mask.

Figure 11:
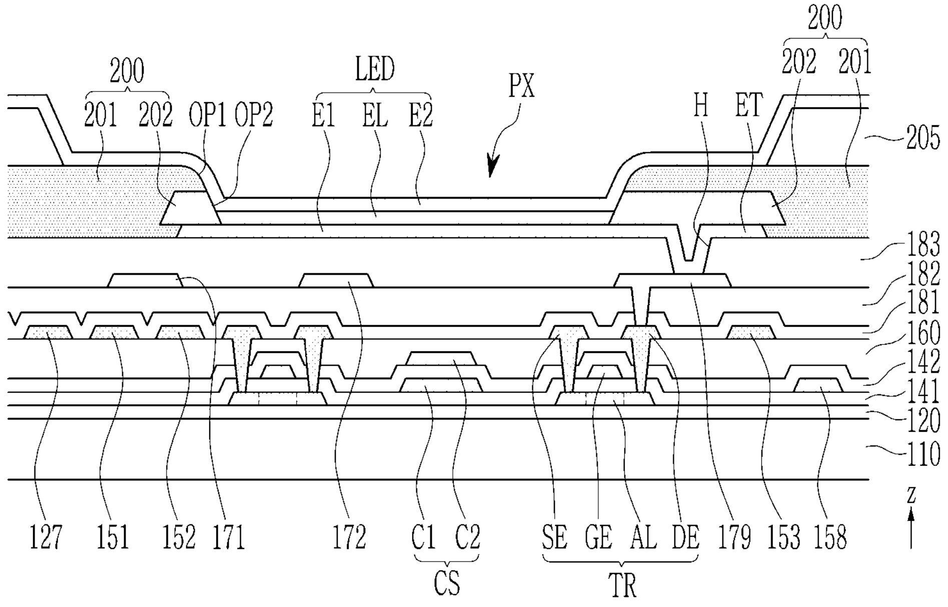

Referring to FIG. 11, the common electrode E2 may be formed on the emission layer EL. The common electrode E2 may be deposited using an open mask. Thereafter, the display panel 10 having a cross-sectional structure as illustrated in FIG. 2 may be manufactured by forming the encapsulation layer 210 and the like.

Meanwhile, after the partition 200 is formed, curing may be performed. During the curing, reflow may be performed in the edge of the first partition 201 due to a high temperature. Accordingly, the first partition 201 may not cover the side surface of the second partition 202 defining the second opening OP2 as in the embodiment of FIG. 2 and the first partition 201 may cover a side surface of the second partition 202 defining the second opening OP2 as in the embodiment of FIG. 3 depending on a degree of reflow of the first partition 201.

Figure 12:
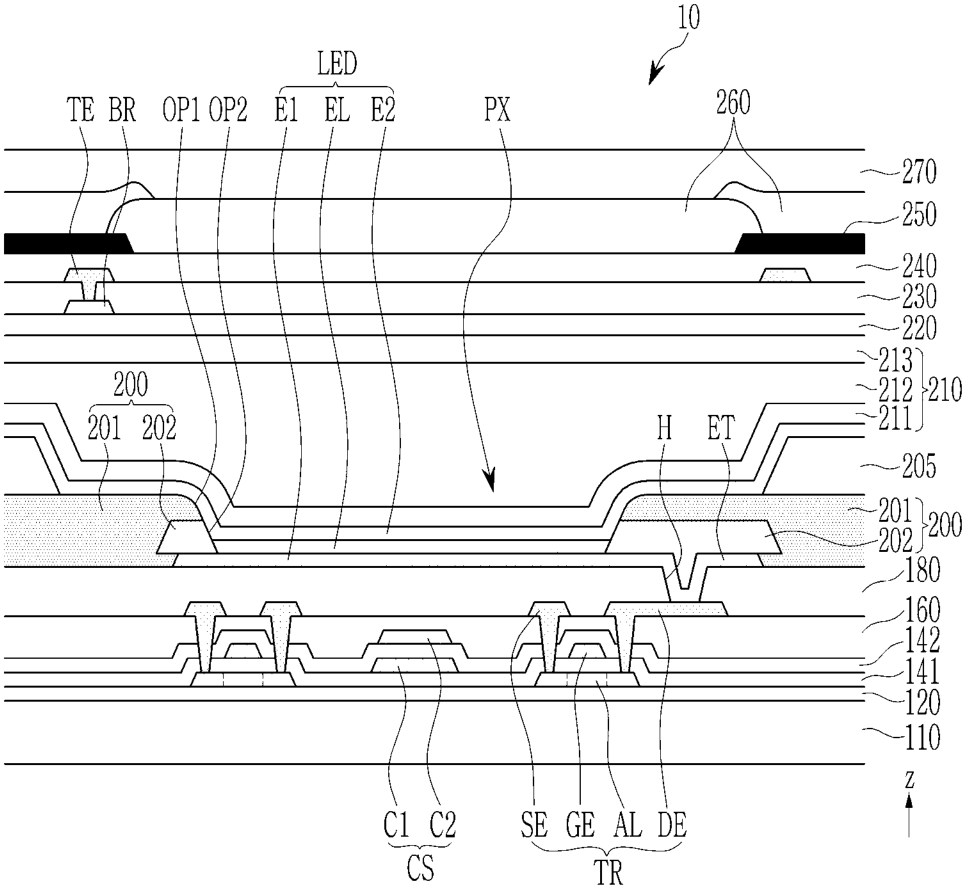
FIG. 12 illustrates a schematic cross-sectional view of one pixel area in a display panel according to an embodiment.

FIG. 12 illustrates a schematic cross-sectional view of one pixel area in a display panel according to an embodiment.

The display panel 10 illustrated in FIG. 12 is different from the display panel 10 illustrated in FIG. 2 in that it does not include a second conductive layer. Specifically, the planarization layer 180 may be positioned on the first data conductive layer including the first electrode SE and the second electrode DE of the transistor TR, and the extension ET of the pixel electrode E1 may be connected to the second electrode DE of the transistor TR through the contact hole H formed in the planarization layer 180. Accordingly, the pixel electrode E1 may be connected to the second electrode DE of the transistor TR through the extension ET. Meanwhile, signal lines such as the initialization voltage line 127, the scan line 151, the previous scan line 152, the emission control line 153, the bypass control line 158, the data line 171, and the driving voltage line described in the embodiment of FIG. 2 may be included in the first gate conductive layer, the second gate conductive layer, the first data conductive layer, or any other possible conductive layer.

Figure 13:
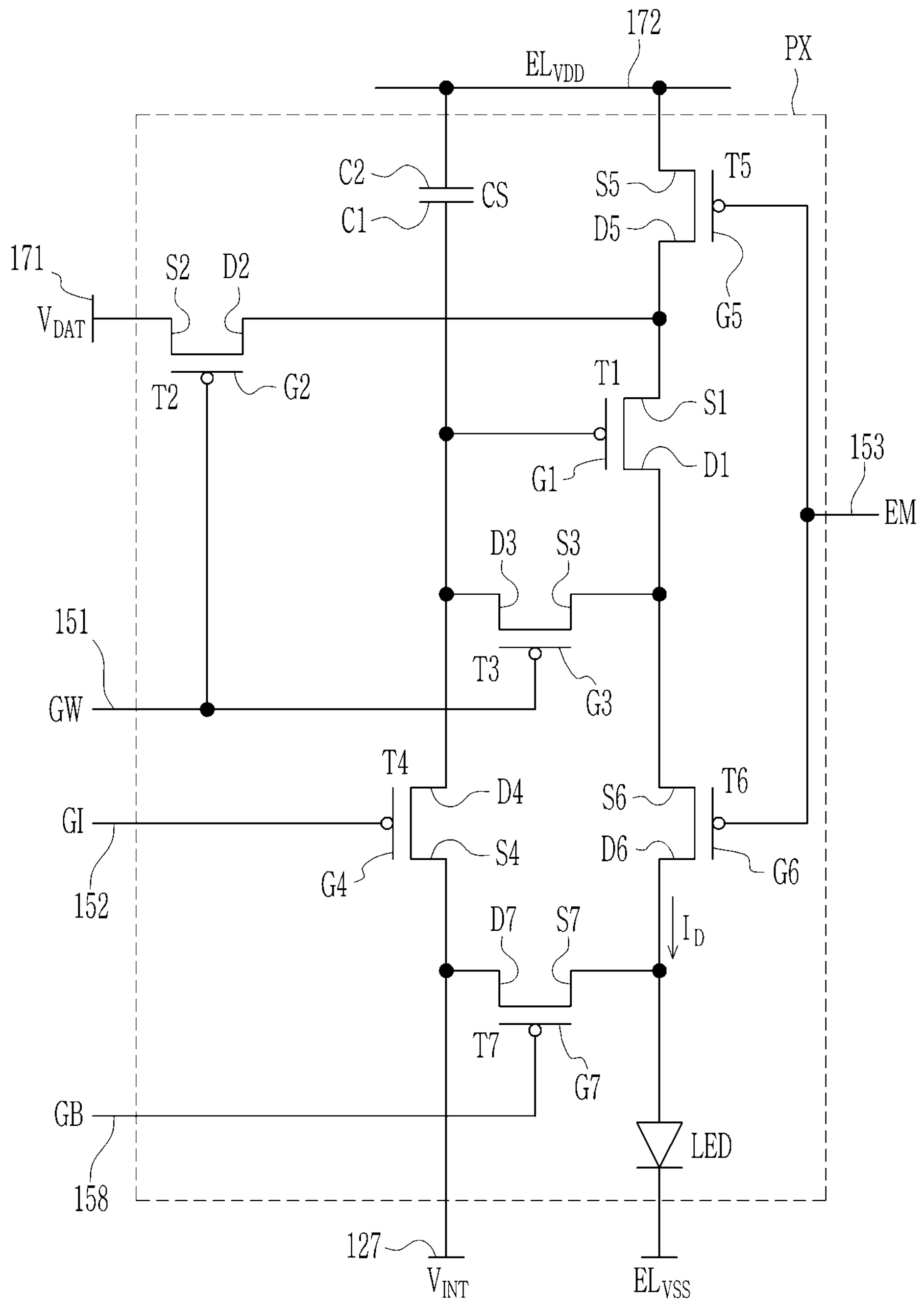
FIG. 13 illustrates a circuit diagram of a pixel of an emissive display device according to an embodiment.

FIG. 13 illustrates a circuit diagram of a pixel of an emissive display device according to an embodiment.

Referring to FIG. 13, the pixel PX may include transistors T1 to T7 connected to signal lines 127, 151, 152, 153, 158, 171, and 172, a storage capacitor CS, and a light emitting diode LED.

The transistors T1 to T7 include a driving transistor T1, a switching transistor T2, a compensation transistor T3, an initialization transistor T4, an operation control transistor T5, an emission control transistor T6, and a bypass transistor T7.

The signal lines 127, 151, 152, 153, 158, 171, and 172 may include an initialization voltage line 127, a scan line 151, a previous-stage scan line 152, an emission control line 153, a bypass control line 158, a data line 171, and a driving voltage line 172.

The scan line 151 may transfer a scan signal GW to the switching transistor T2 and the compensation transistor T3. The previous-stage scan line 152 may transfer a previous-stage scan signal GI to the initialization transistor T4. The emission control line 153 may transfer an emission control signal EM to the operation control transistor T5 and the emission control transistor T6. The bypass control line 158 may transfer a bypass signal GB to the bypass transistor T7. The bypass control line 158 may be connected to the previous-stage scan line 152.

The data line 171 may receive a data voltage $V_{DAT}$, and the driving voltage line 172 and the initialization voltage line 127 may receive a driving voltage $EL_{VDD}$ and an initialization voltage $V_{INT}$, respectively. The initialization voltage $V_{INT}$ may initialize the driving transistor T1.

Each of the transistors T1 to T7 includes gate electrodes G1 to G7, first electrodes S1 to S7, and second electrodes D1 to D7, and the storage capacitor CS includes a first electrode C1 and a second electrode C2. The electrodes of the transistors T1 to T7 and the storage capacitor CS may be connected as illustrated in FIG. 13. An anode of the light emitting diode LED may be connected to the second electrode D1 of the driving transistor T1 through the emission control transistor T6 to receive a driving current $I_D$. A cathode of the light emitting diode LED may receive a common voltage $EL_{VSS}$ (also referred to as a second power voltage or a low potential power voltage).

In a circuit structure of the pixel PX, a number of transistors, a number of capacitors, and connection between them may be variously modified.

While this disclosure has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. An emissive display device comprising:

a substrate;

a transistor disposed on the substrate;

an insulating layer disposed on the transistor;

a pixel electrode disposed on the insulating layer and electrically connected to the transistor; and a partition disposed on the insulating layer and covering at least an edge of the pixel electrode to expose a center of the pixel electrode, wherein the partition includes a first partition in direct contact with a side surface of the pixel electrode, and a second partition in direct contact with an upper surface of the pixel electrode, and wherein the second partition is disposed between the first partition and the pixel electrode to extend beyond the side surface of the pixel electrode to form an undercut portion disposed between the second partition and the insulating layer.

2. The emissive display device of claim 1, wherein the first partition and the pixel electrode are in direct contact with the insulating layer and the second partition is not in direct contact with the insulating layer.

3. The emissive display device of claim 1, wherein a portion of a lower surface of the second partition is in direct contact with the pixel electrode, and a portion of the lower surface of the second partition is in direct contact with the first partition.

4. The emissive display device of claim 1, wherein the second partition protrudes laterally from an edge of the pixel electrode.

5. The emissive display device of claim 1, wherein the opening includes a first opening defined by the first partition and a second opening defined by the second partition, and the first opening and the second opening have substantially a same planar shape.

6. The emissive display device of claim 5, wherein a side surface of the first partition defining the first opening and a side surface of the second partition defining the second opening form substantially a seamless line.

7. The emissive display device of claim 5, wherein the first partition covers at least a portion of a side surface of the second partition defining the second opening.

8. The emissive display device of claim 5, wherein the first partition is in direct contact with an upper surface of the pixel electrode while covering an entire side surface of the second partition defining the second opening.

9. The emissive display device of claim 1, further comprising an emission layer disposed on the pixel electrode, wherein a thickness of the second partition is greater than a thickness of the emission layer.

10. The emissive display device of claim 9, further comprising a common electrode disposed on the emission layer, wherein a thickness of the second partition is greater than a sum of a thickness of the emission layer and a thickness of the common electrode.

11. The emissive display device of claim 1, wherein the first partition is a black partition including a black pigment or a black dye, and the second partition is a transparent partition.

12. The emissive display device of claim 1, further comprising an extension extending from the pixel electrode and connected to the transistor or connected to the transistor via a connecting electrode, wherein the first partition is in direct contact with a side surface of the extension and the second partition is in direct contact with an upper surface of the extension.

13. An emissive display device comprising:

a substrate;

a transistor disposed on the substrate;

an insulating layer disposed on the transistor;

a pixel electrode disposed on the insulating layer, contacting the insulating layer and electrically connected to the transistor;

a partition disposed on the insulating layer, the partition covering at least an edge of the pixel electrode and exposing a center of the pixel electrode;

an emission layer disposed on the pixel electrode to overlap the opening; and a common electrode disposed on the emission layer, wherein the partition includes a first partition in direct contact with the insulating layer and not in direct contact with an upper surface of the pixel electrode, and a second partition in direct contact with the upper surface of the pixel electrode and not in direct contact with the insulating layer, and wherein the second partition is disposed between the first partition and the pixel electrode to extend beyond the side surface of the pixel electrode to form an undercut portion disposed between the second partition and the insulating layer.

14. The emissive display device of claim 13, wherein the first partition is in direct contact with a side surface of the pixel electrode, and the second partition is not in direct contact with the side surface of the pixel electrode.

15. The emissive display device of claim 13, wherein the second partition is spaced apart from the insulating layer by a thickness of the pixel electrode.

16. The emissive display device of claim 15, wherein the first partition fills the undercut portion.

17. The emissive display device of claim 13, further comprising a spacer disposed between the partition and the common electrode, wherein the spacer is in direct contact with the first partition and not in direct contact with the second partition.

18. The emissive display device of claim 13, further comprising an extension extending from the pixel electrode and connected to the transistor or connected to the transistor via a connecting electrode through a contact hole formed in the insulating layer, wherein the first partition is in direct contact with a side surface of the extension and the second partition is in direct contact with an upper surface of the extension.

19. The emissive display device of claim 13, wherein a thickness of the second partition is greater than a sum of a thickness of the emission layer and a thickness of the common electrode.

20. An emissive display device comprising:

a substrate;

a transistor disposed on the substrate;

an insulating layer disposed on the transistor;

a pixel electrode disposed on the insulating layer and electrically connected to the transistor; and a partition disposed on the insulating layer and covering at least an edge of the pixel electrode to expose a center of the pixel electrode, wherein the partition includes a first partition and a second partition that is at least partially covered by the first partition and extends beyond a side surface of the pixel electrode to form an undercut portion disposed between the second partition and the insulating layer, and upper and side surfaces of the second partition are in direct contact with the first partition, and a lower surface of the second partition is in direct contact with the pixel electrode and the first partition.

* * * * *